(12) United States Patent
Yamada et al.

(10) Patent No.: US 6,650,020 B2
(45) Date of Patent: Nov. 18, 2003

(54) RESIN-SEALED SEMICONDUCTOR DEVICE

(75) Inventors: Yuichiro Yamada, Kyoto (JP); Masanori Minamio, Takatsuki (JP)

(73) Assignee: Matsushia Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/166,246

(22) Filed: Jun. 11, 2002

(65) Prior Publication Data

US 2003/0001289 A1 Jan. 2, 2003

(30) Foreign Application Priority Data

Jun. 29, 2001 (JP) ........................................ 2001-198171

(51) Int. Cl.[7] ............................................... H01L 23/48
(52) U.S. Cl. ...................... 257/783; 257/679; 257/669; 257/672; 257/673; 257/676; 257/778; 257/784; 257/782; 257/779; 257/786; 257/780; 438/612; 438/123; 264/272.17
(58) Field of Search .................... 257/783, 782, 257/676, 669, 666, 672, 673, 674, 690, 778, 784, 779, 780, 786; 264/272.17; 438/612, 123

(56) References Cited

U.S. PATENT DOCUMENTS

| | | | |
|---|---|---|---|
| 6,204,553 B1 | * | 3/2001 | Liu et al. ................... 257/676 |
| 6,291,274 B1 | | 9/2001 | Oida et al. |
| 6,396,139 B1 | * | 5/2002 | Huang ........................ 257/696 |

* cited by examiner

*Primary Examiner*—Tom Thomas
*Assistant Examiner*—Junghwa Im
(74) *Attorney, Agent, or Firm*—Nixon Peabody LLP; Donald R. Studebaker

(57) ABSTRACT

The resin-sealed semiconductor device includes a die pad portion, a semiconductor element mounted on the die pad portion and having electrodes, a plurality of lead portions arranged with their respective tips facing the die pad portion, thin metal wires for connecting the electrodes of the semiconductor element to the lead portions, and a sealing resin for sealing the die pad portion, the semiconductor element, the lead portions and connection regions of the thin metal wires except a bottom surface of the die pad portion and respective bottom surfaces and terminal ends of the lead portions. The terminal ends of the lead portions are approximately flush with a side surface of the sealing resin. The die pad portion has a first recess formed in an outer periphery of the bottom surface thereof.

4 Claims, 12 Drawing Sheets

RESIN-SEALED SEMICONDUCTOR DEVICE

BACKGROUND OF THE INVENTION

The present invention generally relates to a resin-sealed semiconductor device in which a die pad portion having a semiconductor element mounted thereon is exposed from a sealing resin, and a manufacturing method thereof. More particularly, the present invention relates to a resin-sealed semiconductor device preventing generation of resin voids within a sealing resin, and a manufacturing method thereof.

Recent reduction in size of electronic equipments requires high-density packaging of semiconductor components such as a resin-sealed semiconductor device. In response to such a requirement, the semiconductor components are increasingly reduced in size and thickness. In addition to such a trend, semiconductor devices having an increased number of pins are increasingly produced. Accordingly, there is a demand for a small, thin, high-density resin-sealed semiconductor device.

Hereinafter, a conventional resin-sealed semiconductor device having a die pad portion exposed from a resin will be described. FIGS. 11A to 11C show a conventional resin-sealed semiconductor device. FIG. 11A is a plan view, FIG. 11B is a bottom view, and FIG. 11C is a cross-sectional view taken along line A–A1 in FIG. 11B.

As shown in FIGS. 11A to 11C, a semiconductor element 102 is mounted on a die pad portion 101 of a lead frame. The semiconductor element 102 is electrically connected to inner lead portions 103 by thin metal wires 104. The semiconductor element 102 on the die pad portion 101 and the inner lead portions 103 are sealed with a sealing resin 105. The side surface of the sealing resin 105 is flush with the terminal ends of the inner lead portions 103. The bottom surface of the die pad portion 101 is exposed from the sealing resin 105. The tips of the inner lead portions 103 are exposed as external terminals 106.

Hereinafter, a method for manufacturing the conventional resin-sealed semiconductor device will be described. FIGS. 12A to 12D are cross-sectional views illustrating the steps of the method for manufacturing the conventional resin-sealed semiconductor device using a lead frame.

As shown in FIG. 12A, a lead frame is first prepared. The lead frame has a frame portion, a rectangular die pad portion 101 provided within the frame portion, for mounting a semiconductor element thereon, suspended lead portions for supporting the die pad portion 101, and beam-like inner lead portions 103 to be electrically connected to the semiconductor element mounted on the die pad portion 101 by connecting means such as thin metal wires.

As shown in FIG. 12B, a semiconductor element 102 is then bonded to the die pad portion 101 of the lead frame by an adhesive such as silver paste (die bonding step).

As shown in FIG. 12C, electrode pads (not shown) on the surface of the semiconductor device 102 mounted on the die pad portion 101 are respectively connected with the tips of the inner lead portions 103 of the lead frame by thin metal wires 104 (wire bonding step).

As shown in FIG. 12D, with a sealing sheet in close contact with the lead frame, the die pad portion 101, the semiconductor element 102 and the inner lead portions 103 are sealed with a sealing resin 105. In the illustrated example, the sealing step is conducted with the sealing sheet in close contact with the bottom surface of the lead frame. Therefore, the die pad portion 101, the suspended lead portions, the semiconductor element 102, the inner lead portions 103 and the connection regions of the thin metal wires 104 are sealed except the bottom surface of the die pad portion 101 and the bottom surface of each inner lead portion 103. As a result, the bottom surface of the die pad portion 101 is exposed from the bottom surface of the sealing resin 105.

In the conventional resin-sealed semiconductor device and the manufacturing method thereof, a semiconductor element is first mounted on a lead frame and electrical connection thereof is then conducted using thin metal wires. The subsequent resin sealing step is conducted with a sealing sheet in close contact with the bottom surface of the lead frame. In the resin sealing step, however, the air may be introduced into the interface between the sealing sheet and the die pad portion and the inner lead portions of the lead frame. In this case, this air is trapped at the interface without being forced to air vents formed in a mold. As a result, the air is trapped at the end of the die pad, whereby resin voids are generated in the sealing resin near the die pad portion. Recently, such a phenomenon often occurs in the resin sealing step using both a multi-pin, high-density lead frame having leads arranged at smaller intervals and a sealing sheet. This is extremely problematic in manufacturing a resin-sealed semiconductor device having a die pad portion exposed from a resin.

Resin voids thus produced in the sealing resin would generate cracks within the resin during operation in the heating environment, hindering mounting of the resin-sealed semiconductor device on a circuit board. This is not preferable in terms of reliability.

SUMMARY OF THE INVENTION

The present invention is made to solve the above conventional problems, and it is an object of the present invention to provide a resin-sealed semiconductor device having a die pad portion exposed from a sealing resin and a manufacturing method thereof, which prevent generation of resin voids within a sealing resin.

According to one aspect of the present invention, a resin-sealed semiconductor device includes a die pad portion for mounting a semiconductor element thereon, a semiconductor element mounted on the die pad portion and having electrodes, a plurality of lead portions arranged with their respective tips facing the die pad portion, thin metal wires for connecting the electrodes of the semiconductor element to the lead portions, and a sealing resin for sealing the die pad portion, the semiconductor element, the lead portions and connection regions of the thin metal wires except a bottom surface of the die pad portion and respective bottom surfaces and terminal ends of the lead portions. The terminal ends of the lead portions are approximately flush with a side surface of the sealing resin. The die pad portion has a first recess formed in an outer periphery of the bottom surface thereof.

Preferably, the resin-sealed semiconductor device further includes suspended lead portions for supporting the die pad portion.

Preferably, the die pad portion has an upward projecting support portion for supporting the semiconductor element. A second recess is provided at a region of the bottom surface of the die pad portion that corresponds to the support portion. The first recess formed at the bottom surface of the die pad portion is a groove-like recess extending from an outer end of the bottom surface of the die pad portion to the second recess.

Preferably, at least the lead portions include first lead portions arranged with their respective tips facing the die pad portion, and second lead portions extending so that their respective tips are located at a position closer to the die pad portion than are the tips of the first lead portions.

Preferably, respective bottom surfaces of the first lead portions and respective bottom surfaces of the second lead portions form land electrodes. The land electrodes are arranged in at least two rows in a bottom surface region of the sealing resin when viewed two-dimensionally.

According to another aspect of the present invention, a method for manufacturing a resin-sealed semiconductor device includes the steps of: preparing a lead frame having a die pad portion provided within a frame portion formed from a metal plate, for mounting a semiconductor element thereon, a plurality of lead portions arranged with their respective tips facing the die pad portion and their respective terminal ends connected to the frame portion, and a sealing sheet attached in close contact with respective bottom surfaces of the lead portions and a bottom surface of the die pad portion, the die pad portion having a first recess formed in an outer periphery of the bottom surface thereof; mounting a semiconductor element having electrodes on the die pad portion of the prepared lead frame with a main surface of the semiconductor element facing upward; connecting the electrodes of the semiconductor element thus mounted on the die pad portion to the lead portions of the lead frame by thin metal wires; and sealing an upper side of the lead frame with a sealing resin so that the die pad portion, the semiconductor element, the lead portions and connection regions of the thin metal wires are sealed except the bottom surface of the die pad portion and the respective bottom surfaces of the lead portions.

Preferably, in the resin sealing step, air trapped between the sealing sheet and the die pad portion of the lead frame is released into the first recess formed at the bottom surface of the die pad portion.

Preferably, after the resin sealing step, the terminal ends of the lead portions are cut away so that the resultant terminal ends of the lead portions are approximately flush with a side surface of the sealing resin.

According to still another aspect of the present invention, a method for manufacturing a resin-sealed semiconductor device includes the steps of: preparing a lead frame having a die pad portion provided within a frame portion formed from a metal plate, for mounting a semiconductor element thereon, suspended lead portions supporting an outer periphery of the die pad portion with their respective tips and connected to the frame portion at their respective terminal ends, and a plurality of lead portions arranged with their respective tips facing the die pad portion and their respective terminal ends connected to the frame portion, the die pad portion having a first recess formed in an outer periphery of a bottom surface thereof; mounting a semiconductor element having electrodes on the die pad portion of the prepared lead frame with a main surface of the semiconductor element facing upward; connecting the electrodes of the semiconductor element thus mounted on the die pad portion to the lead portions of the lead frame by thin metal wires; and attaching a sealing sheet in close contact with at least respective bottom surfaces of the lead portions and the bottom surface of the die pad portion out of a bottom surface of the lead frame, and sealing an upper side of the lead frame with a sealing resin so that the die pad portion, the suspended lead portions, the semiconductor element, the lead portions and connection regions of the thin metal wires are sealed except the bottom surface of the die pad portion and the respective bottom surfaces of the lead portions.

Preferably, after the resin sealing step, the respective terminal ends of the suspended lead portions and the lead portions are cut away so that the resultant terminal ends of the suspended lead portions and the lead portions are approximately flush with a side surface of the sealing resin.

As described above, in the resin-sealed semiconductor device of the present invention, the die pad portion has a first recess formed in the outer periphery of the bottom surface thereof. This structure allows the air (air bubbles) trapped at the interface between the sealing sheet and the die pad portion in the resin sealing step to be released into the first recess or released through the first recess into the second recess formed at the bottom surface of the die pad portion. This prevents the air from remaining at the interface in the resin sealing step, thereby enabling implementation of a void-less resin-sealed semiconductor device. In particular, when the die pad portion has an upward projecting support portion, the air can be released into the second recess under the support portion. This prevents voids from remaining in the sealing resin.

In the manufacturing method of the resin-sealed semiconductor device of the present invention, the resin sealing step is conducted while allowing the air trapped between the sealing sheet and the die pad portion of the lead frame to be released into the first recess formed at the bottom surface of the die pad portion. Generation of resin voids is thus prevented.

DESCRIPTION OF THE PREFERRED EMBODIMENTS

Hereinafter, embodiments of a resin-sealed semiconductor device and a manufacturing method thereof will be described with reference to the accompanying drawings. Note that the present invention is not limited to the embodiments described below.

(First Embodiment)

Figure 1A:
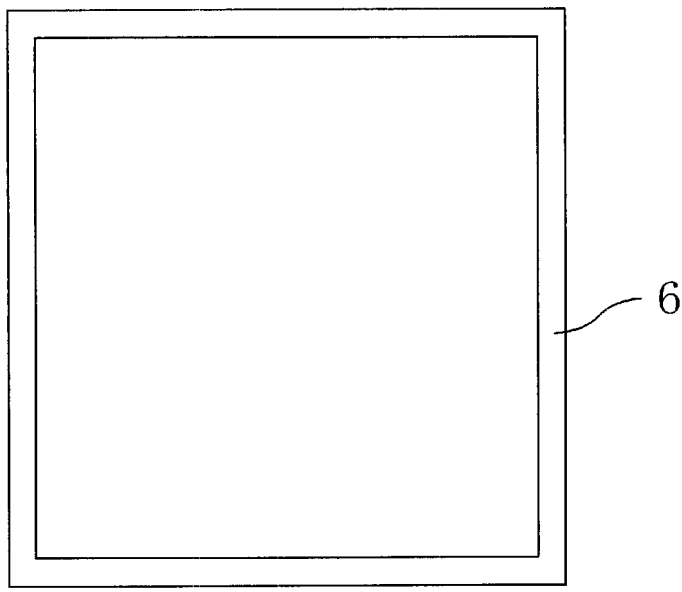
FIG. 1A is a plan view of a resin-sealed semiconductor device according to a first embodiment of the present invention.
Figure 1B:
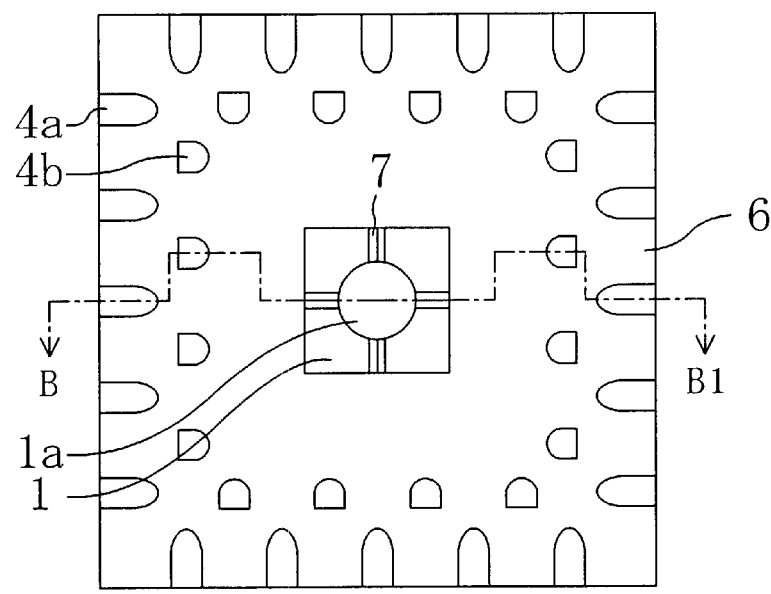
FIG. 1B is a bottom view thereof.
Figure 1C:
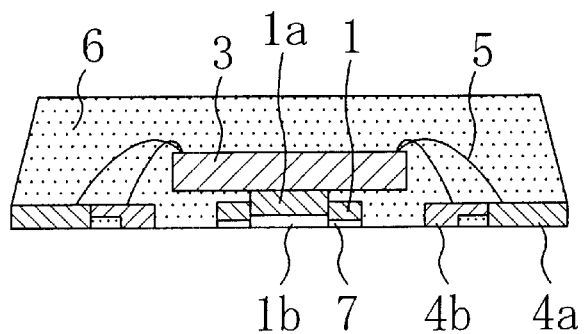
FIG. 1C is a cross-sectional view thereof.

FIGS. 1A to 1C show a resin-sealed semiconductor device according to the first embodiment. FIG. 1A is a plan view thereof, FIG. 1B is a bottom view thereof, and FIG. 1C is a cross-sectional view taken along line B–B1 in FIG. 1B.

As shown in FIGS. 1A to 1C, the resin-sealed semiconductor device of the present embodiment includes a die pad portion 1 on which a semiconductor element is mounted, a semiconductor element 3, a plurality of lead portions arranged with their respective tips facing the die pad portion 1, thin metal wires 5, and a sealing resin 6. The die pad portion 1 has a support portion 1a which is half-cut therefrom. The semiconductor element 3 is mounted on the support portion 1a of the die pad portion 1. The plurality of lead portions include first lead portions 4a arranged with their respective tips facing the die pad portion 1, and second lead portions 4b extending so that their respective tips are located at a position closer to the die pad portion 1 than are the tips of the first lead portions 4a. The thin metal wires 5 connect electrodes of the semiconductor element 3 with the first and second lead portions 4a, 4b. The sealing resin 6 seals the die pad portion 1, the semiconductor element 3, the first and second lead portions 4a, 4b, and the connection regions of the thin metal wires 5 except the bottom surface of the die pad portion 1 and the respective bottom surfaces and terminal ends of the first and second lead portions 4a, 4b. The terminal ends of the first and second lead portions 4a, 4b are approximately flush with the side surface of the sealing resin 6. This resin-sealed semiconductor device has first recesses 7 at the bottom surface of the die pad portion 1.

As shown in FIG. 1B, the resin-sealed semiconductor device of the present embodiment is a land grid array-type resin-sealed semiconductor device. More specifically, the respective bottom surfaces of the first and second lead portions 4a, 4b form land electrodes. The land electrodes are arranged at least in two rows in the bottom surface region of the sealing resin 6 when viewed two-dimensionally.

Hereinafter, the structure of the die pad portion in the resin-sealed semiconductor device of the present embodiment will be described.

Figure 2A:
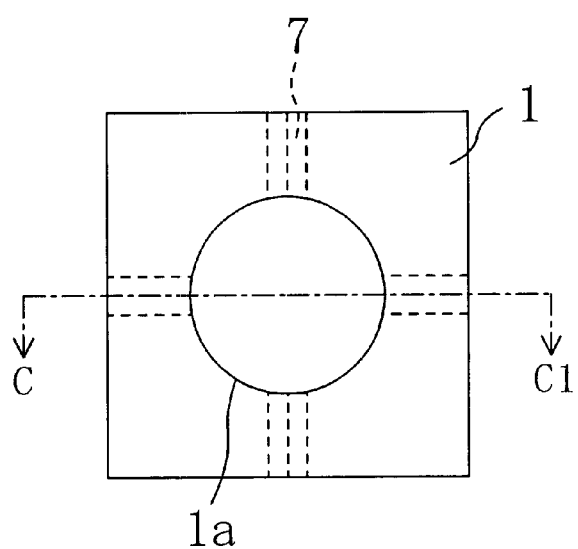
FIG. 2A is a plan view of a die pad portion of the resin-sealed semiconductor device according to the first embodiment of the present invention.
Figure 2B:
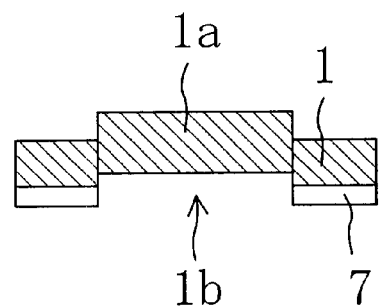
FIG. 2B is a cross-sectional view thereof.
Figure 2C:
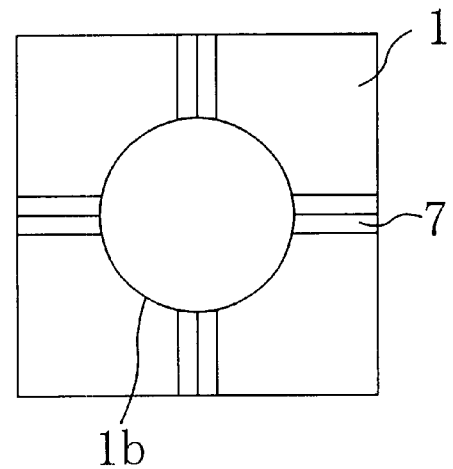
FIG. 2C is a bottom view thereof.

FIGS. 2A to 2C show the structure of the die pad portion. FIG. 2A is a plan view of the die pad portion, FIG. 2B is a cross-sectional view taken along line C–C1 of FIG. 2A, and FIG. 2C is a bottom view of the die pad portion.

As shown in FIGS. 2A, 2B and 2C, the die pad portion 1 used in the resin-sealed semiconductor device of the present embodiment has an approximately rectangular shape when viewed two-dimensionally. The die pad portion 1 has an upward projecting support portion 1a approximately in the center thereof in order to support a semiconductor element. The die pad portion 1 is formed from a metal plate, and the support portion 1a is formed by pressing the metal plate upward so that the support portion 1a is half-cut from the die pad portion 1. As a result, a second recess 1b is formed under the support portion 1a of the die pad portion 1a. V-grooves are formed in the outer periphery of the bottom surface of the die pad portion 1 as first recesses 7. The V-grooves extend from the four sides of the bottom surface of the die pad portion 1 (i.e., from the outer peripheral edge of the bottom surface of the die pad portion 1) to the second recess 1b. The air (air bubbles) trapped at the interface between the sealing sheet and the die pad portion 1 in the resin sealing step can be released through the first recesses 7 into the second recess 1b under the die pad portion 1. This structure thus prevents generation of voids.

In the resin-sealed semiconductor device of the present embodiment, the die pad portion 1 has the first recesses 7 so that the air (air bubbles) trapped at the interface between the sealing sheet and the die pad portion 1 in the resin sealing step can be released into the first recesses 7. This prevents the air from remaining at the interface in the resin sealing step, thereby enabling implementation of a void-less resin-sealed semiconductor device. In particular, the upward projecting support portion 1a of the die pad portion 1 allows the trapped air to be released through the first recesses 7 into the second recess 1b under the support portion 1a. This prevents voids from remaining in the sealing resin.

Hereinafter, a manufacturing method of the resin-sealed semiconductor device of the present embodiment will be described.

Figure 3A:
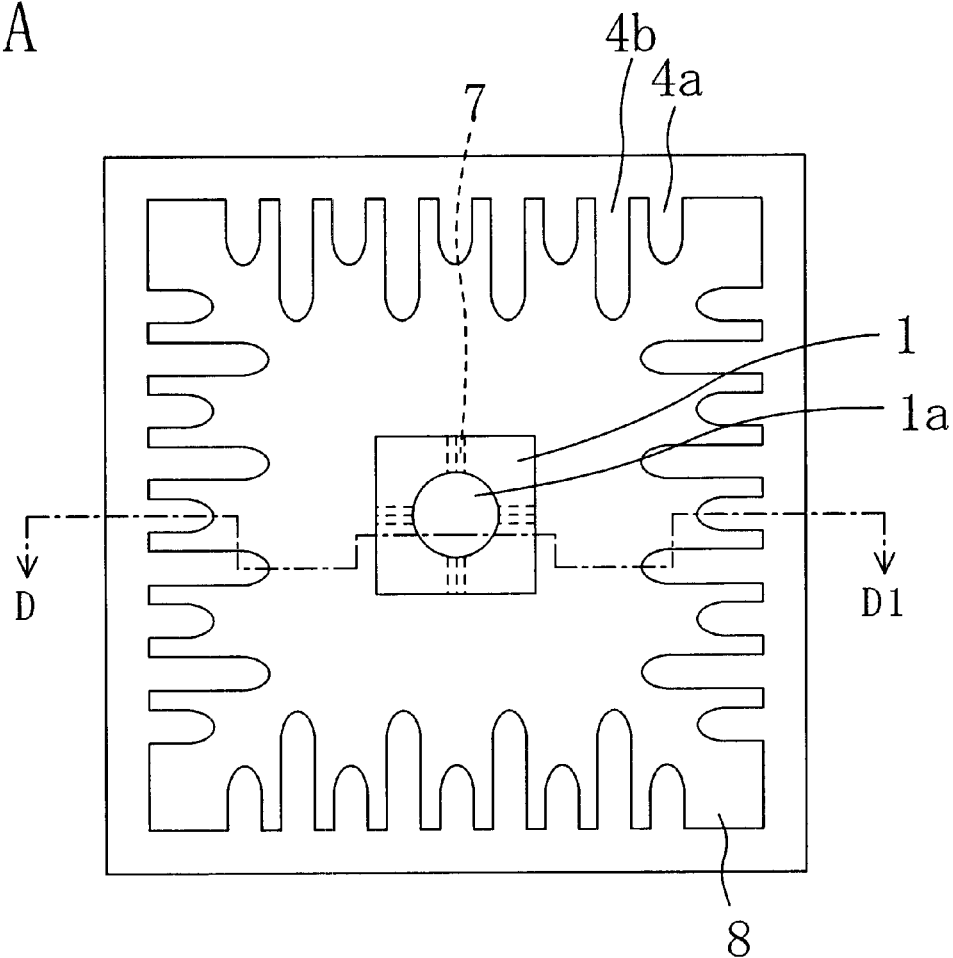
FIG. 3A is a plan view of a lead frame for use in a manufacturing method of the resin-sealed semiconductor device according to the first embodiment of the present invention.
Figure 3B:
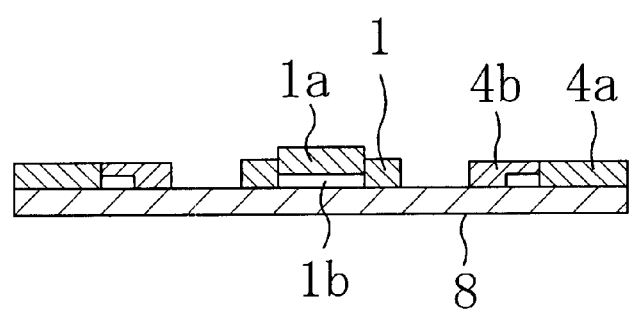
FIG. 3B is a cross-sectional view thereof.

FIGS. 3A, 3B, 4A to 4D and 5 illustrate the manufacturing method of the resin-sealed semiconductor device according to the present embodiment. FIGS. 3A and 3B show a lead frame used in the manufacturing method of the resin-sealed semiconductor device of the present embodiment. FIG. 3A is a plan view of the lead frame, and FIG. 3B is a cross-sectional view taken along line D–D1 in FIG. 3A. FIGS. 4A to 4D and 5 are cross-sectional views illustrating the main steps of the manufacturing method.

First, the lead frame used in the manufacturing method of the resin-sealed semiconductor device of the present embodiment will be described.

The lead frame is formed from a metal plate of a copper material, 42-alloy or the like that is commonly used for lead frames. As shown in FIGS. 3A and 3B, the lead frame includes an approximately rectangular die pad portion 1, first linear lead portions 4a and second linear lead portions 4b. The die pad portion 1 has a support portion 1a on which a semiconductor element is to be mounted. The first and second lead portions 4a, 4b have their respective tips facing the die pad portion 1 and their respective terminal ends connected to a frame portion of the lead frame. The bottom surfaces of the tips of the first and second lead portions 4a, 4b serve as external terminals (land portions). In addition to the bottom surface of the respective tips, the first lead portions 4a can also be connected to a mount substrate at their respective outer side surfaces. In other words, the respective outer side surfaces of the first lead portions 4a also serve as external terminals. A sealing sheet 8 is attached in close contact with the bottom surface of the lead frame. Note that the sealing sheet 8 is in close contact with the respective bottom surfaces of the first and second lead portions 4a, 4b and the bottom surface of the die pad portion 1.

More specifically, the die pad portion 1 has a circular support portion 1a approximately in the center of the surface thereof. The die pad portion 1 is formed from a flat plate, and the support portion 1a is formed by pressing the flat plate so that the support portion 1a is half-cut from the die pad portion 1. The support portion 1a thus projects upward from the remaining region of the die pad portion 1. As a result, a second recess 1b is formed under the support portion 1a. The support portion 1a substantially serves to support the semiconductor element. Therefore, the semiconductor element is mounted on the die pad portion 1 with a gap between the surface of the die pad portion 1 excluding the support portion 1a and the back surface of the semiconductor element. In the present embodiment, the die pad portion 1 is formed from a metal plate having a thickness of 200 µm (which is a lead frame thickness), and the support portion 1a projects by 50 µm to 100 µm from the surface of the die pad portion 1 (i.e., 25% to 50% of the thickness of the metal plate). First recesses 7 (V-grooves) are formed by a half-etching process so as to extend from the four sides of the bottom surface of the die pad portion 1 to the second recess 1b.

The first and second lead portions 4a, 4b in the lead frame of the present embodiment are connected to the frame portion and alternately arranged in parallel. The first and second lead portions 4a, 4b are arranged with their respective tips facing the die pad portion 1. More specifically, the second lead portions 4b extend so that their tips are located at a position closer to the die pad portion 1 than are the tips of the first lead portions 4a. The respective tips of the first and second lead portions 4a, 4b are thus arranged in a staggered manner when viewed two-dimensionally. As a result, when the semiconductor element is mounted and resin-sealed, external terminals are arranged in two rows in a staggered manner at the bottom surface of the package, and the bottom surfaces of the tips of the first and second lead portions 4a, 4b are located at the bottom surface of the package. Each of the first and second lead portions 4a, 4b is a linear lead having a land portion at the bottom surface of its tip. Each land portion has a curvature at its tip, and serves as an external terminal. Each of the second lead portions 4b has a reduced thickness in the region other than the land portion by a half-etch process. The land portion has an original thickness of the second lead portion 4b.

Hereinafter, a process of manufacturing the resin-sealed semiconductor device using the above lead frame will be described.

Figure 4A:
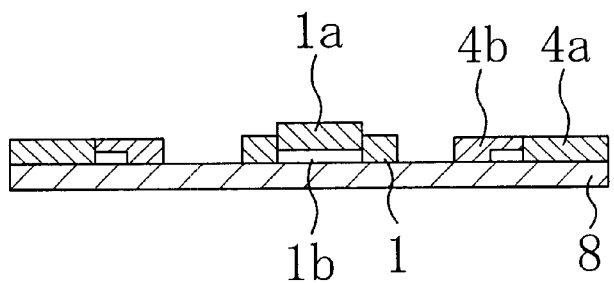
FIG. 4A is a cross-sectional view illustrating the step of preparing a lead frame in the manufacturing method of the resin-sealed semiconductor device according to the first embodiment of the present invention.

First, as shown in FIG. 4A, a lead frame is prepared. The lead frame has a die pad portion 1 provided within a frame portion formed from a metal plate, for mounting a semiconductor element thereon, and a plurality of first and second lead portions 4a, 4b. The plurality of first and second lead portions 4a, 4b have their respective tips facing the die pad portion 1 and their respective terminal ends connected to the frame portion. A sealing sheet 8 is in close contact with the bottom surface of the lead frame. The die pad portion 1 has first recesses at its bottom surface.

Figure 4B:
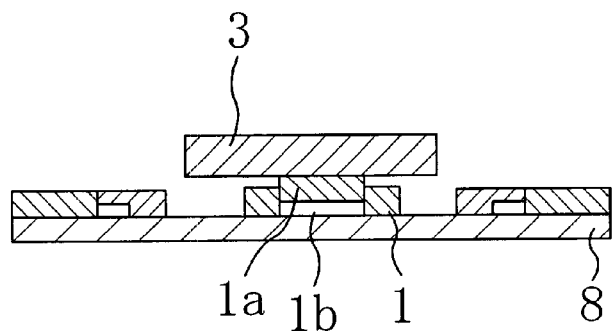
FIG. 4B is a cross-sectional view illustrating the step of mounting a semiconductor element.

As shown in FIG. 4B, a semiconductor element 3 is then bonded to the support portion 1a of the die pad portion 1 of the lead frame with the main surface of the semiconductor element 3 facing upward.

Figure 4C:
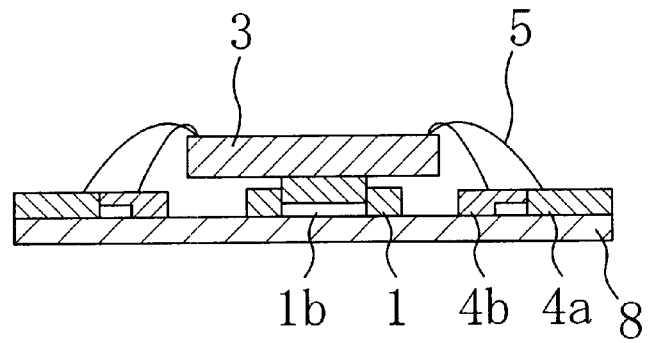
FIG. 4C is a cross-sectional view illustrating the connecting step using thin metal wires.

As shown in FIG. 4C, electrodes of the semiconductor element 3 thus mounted on the die pad portion 1 are electrically connected to the first and second lead portions 4a, 4b of the lead frame by thin metal wires 5.

Figure 4D:
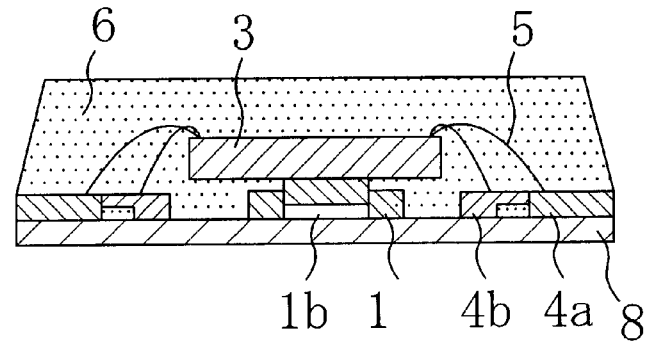
FIG. 4D is a cross-sectional view illustrating the resin sealing step.

As shown in FIG. 4D, the upper side of the lead frame is sealed with a sealing resin 6. As a result, the die pad portion 1, the semiconductor element 3, the first and second lead portions 4a, 4b and the connection regions of the thin metal wires 5 are sealed except the bottom surface of the die pad portion 1 and the respective bottom surfaces of the first and second lead portions 4a, 4b.

In this sealing step, the air trapped between the sealing sheet 8 and the die pad portion 1 of the lead frame is released through the first recesses (which extend from the four sides of the die pad portion 1 to the second recess 1b) into the second recess 1b under the support portion 1a of the die pad portion 1. This sealing step thus prevents generation of resin voids. A resin mold normally has air vents. In a semiconductor device having lead portions densely arranged at a small pitch as in the present embodiment, however, the resin sealing step is completed before the trapped air moves to the air vents of the mold. As a result, voids are generated in the resin. In the present embodiment, however, the die pad portion has the first recesses. The first recesses allow the air to be released into the second recess 1b under the support portion 1a of the die pad portion 1 even if it cannot move to the air vents of the mold. Generation of resin voids is thus prevented.

Figure 5:
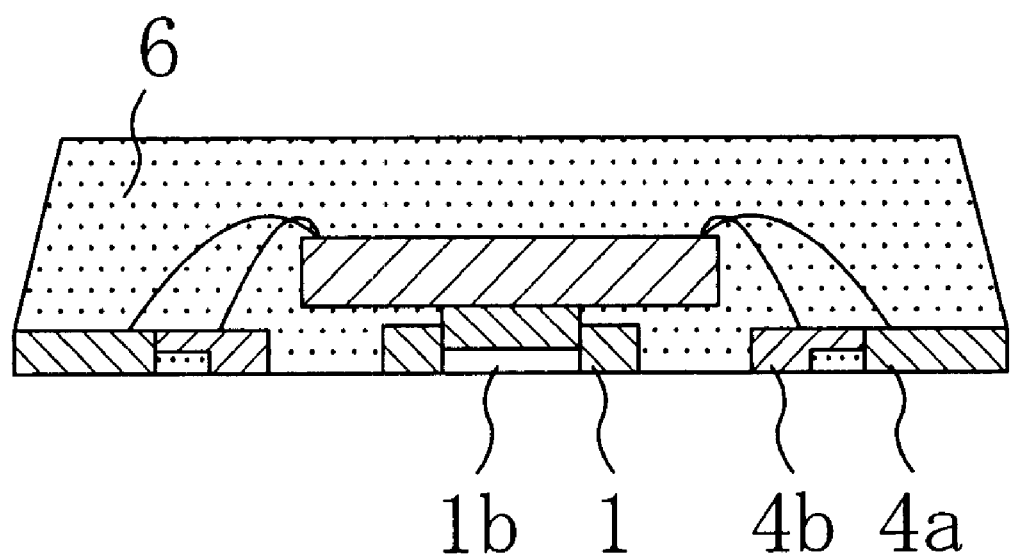
FIG. 5 is a cross-sectional view illustrating the manufacturing method of the resin-sealed semiconductor device according to the first embodiment of the present invention.

As shown in FIG. 5, after the resin sealing step, the terminal ends of the first and second lead portions 4a, 4b are cut away so that the resultant terminal ends of the first and second lead portions 4a, 4b are approximately flush with the side surface of the sealing resin 6. In this way, the resin-sealed semiconductor device having the same structure as that described in connection with FIG. 1 is obtained. The resin-sealed semiconductor device of FIG. 5 is a reliable resin-sealed semiconductor device having no resin void generated near the die pad portion 1.

In the resin-sealed semiconductor device and the manufacturing method thereof according to the present embodiment, the die pad portion of the lead frame has first recesses, and the air trapped at the interface between the sealing sheet and the die pad portion in the resin sealing step can be released into the first recesses. This prevents the air from remaining at the interface in the resin sealing step and enables implementation of a void-less resin-sealed semiconductor device. Especially, since the die pad portion has an upward projecting support portion, the air can be released through the first recesses into the second recess under the support portion. This prevents voids from remaining in the sealing resin.

Note that a resin-sealed semiconductor device having lead portions arranged in two rows is described in the present embodiment. However, the resin-sealed semiconductor device of the present invention may alternatively have the lead portions arranged in a row or in three or more rows. The present invention is widely applicable to a manufacturing method of a resin-sealed semiconductor device having only one side sealed with a resin and having a die pad portion exposed from the resin.

The sealing resin may either be present or may not be present in the second recess of the die pad portion. This is because resin voids in the second recess have no influence on mounting of the resin-sealed semiconductor device.

The first recesses are not limited to V-grooves. The first recesses may have any shape as long as they are formed at the bottom surface of the die pad portion. For example, the first recesses may be U-grooves (troughs), grooves having their respective sidewalls extending perpendicularly to the bottom surface of the die pad portion and their respective bottoms extending in parallel with the bottom surface of the die pad portion, grooves having their respective sidewalls tilted as in V-grooves and their respective bottoms extending in parallel with the bottom surface of the die pad portion, or undercut slots.

A plurality of lead frames of the present embodiment may be resin-sealed at a time. In this case, the resin sealing step is conducted with the plurality of lead frames arranged adjacent to each other on a flat surface. Such a resin sealing method is called "map molding". In this method, the air is likely to remain in the sealing resin. Therefore, it is preferable to use the lead frame and the manufacturing method of the present embodiment.

(Second Embodiment)

Figure 6A:
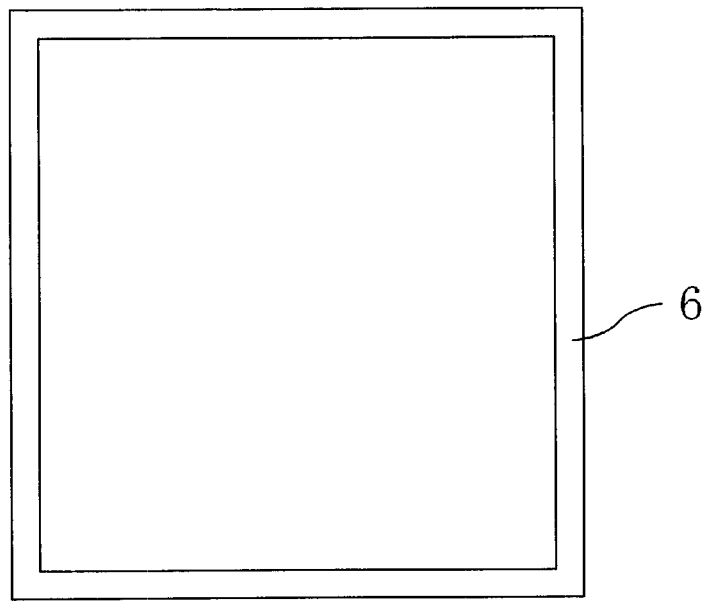
FIG. 6A is a plan view of a resin-sealed semiconductor device according to a second embodiment of the present invention.
Figure 6B:
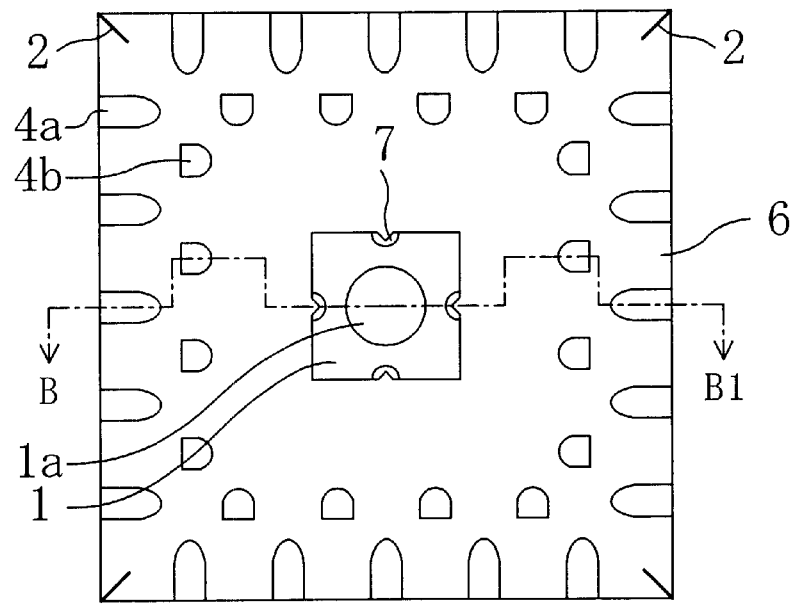
FIG. 6B is a bottom view thereof.
Figure 6C:
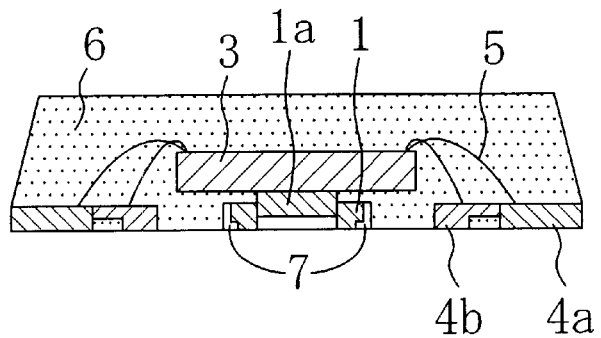
FIG. 6C is a cross-sectional view thereof.

FIGS. 6A to 6C show a resin-sealed semiconductor device of the second embodiment. FIG. 6A is a plan view thereof, FIG. 6B is a bottom view thereof, and FIG. 6C is a cross-sectional view taken along line B–B1 in FIG. 6B.

As shown in FIGS. 6A to 6C, the resin-sealed semiconductor device of the second embodiment is different from the first embodiment in that the resin-sealed semiconductor device of the second embodiment includes suspended lead portions 2 supporting the die pad portion 1 and sealed with the sealing resin 6. The resin-sealed semiconductor device of the second embodiment is also different from the first embodiment in the shape of the first recesses 7 formed at the bottom surface of the die pad portion 1. The arrangement, structure and shape of the resin-sealed semiconductor device of the second embodiment are otherwise the same as those of the first embodiment. Hereinafter, the structure and shape of the resin-sealed semiconductor device and the manufacturing method thereof will be described only in terms of the differences from the first embodiment, and description of the same points as those of the first embodiment will be omitted or given briefly.

Hereinafter, the structure of the die pad portion in the resin-sealed semiconductor device of the present embodiment will be described.

Figure 7A:
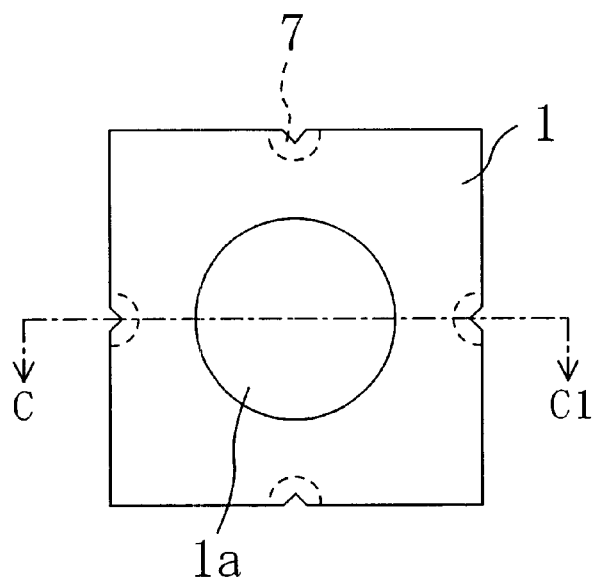
FIG. 7A is a plan view of a die pad portion of the resin-sealed semiconductor device according to the second embodiment of the present invention.
Figure 7B:
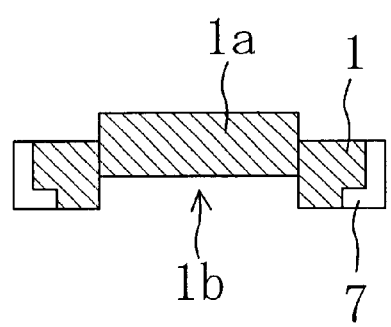
FIG. 7B is a cross-sectional view thereof.
Figure 7C:
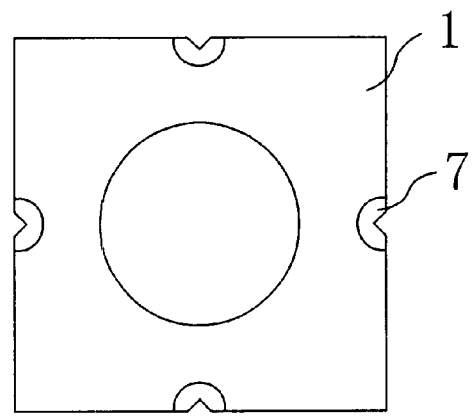
FIG. 7C is a bottom view thereof.

FIGS. 7A to 7C show the structure of the die pad portion 1. FIG. 7A is a plan view of the die pad portion 1, FIG. 7B is a cross-sectional view taken along line C–C1 in FIG. 7A, and FIG. 7C is a bottom view of the die pad portion 1.

As shown in FIGS. 7A, 7B and 7C, the die pad portion 1 used in the resin-sealed semiconductor device of the present embodiment has an upward projecting support portion 1a approximately in the center thereof in order to support a semiconductor element, as in the first embodiment. A second recess 1b is formed under the support portion 1a. A notch is formed at each side surface of the die pad portion 1, and first recesses 7 are formed in the outer periphery of the bottom surface of the die pad portion 1. The air (air bubbles) trapped at the interface between the sealing sheet and the die pad portion 1 in the resin sealing step can be released into the first recesses 1, whereby generation of voids is prevented. The first recesses 7 are respectively connected to the above notches, and extend from the four sides of the bottom surface of the die pad portion 1 to a position approximately halfway between the respective sides of the bottom surface of the die pad portion 1 and the second recess 1b.

In the resin-sealed semiconductor device of the present embodiment, the die pad portion 1 has the first recesses 7 so that the air (air bubbles) trapped at the interface between the sealing sheet and the die pad portion 1 in the resin sealing step can be released into the first recesses 7. This prevents the air from remaining at the interface in the resin sealing step, thereby enabling implementation of a void-less resin-sealed semiconductor device.

Hereinafter, a manufacturing method of the resin-sealed semiconductor device of the present embodiment will be described.

Figure 8A:
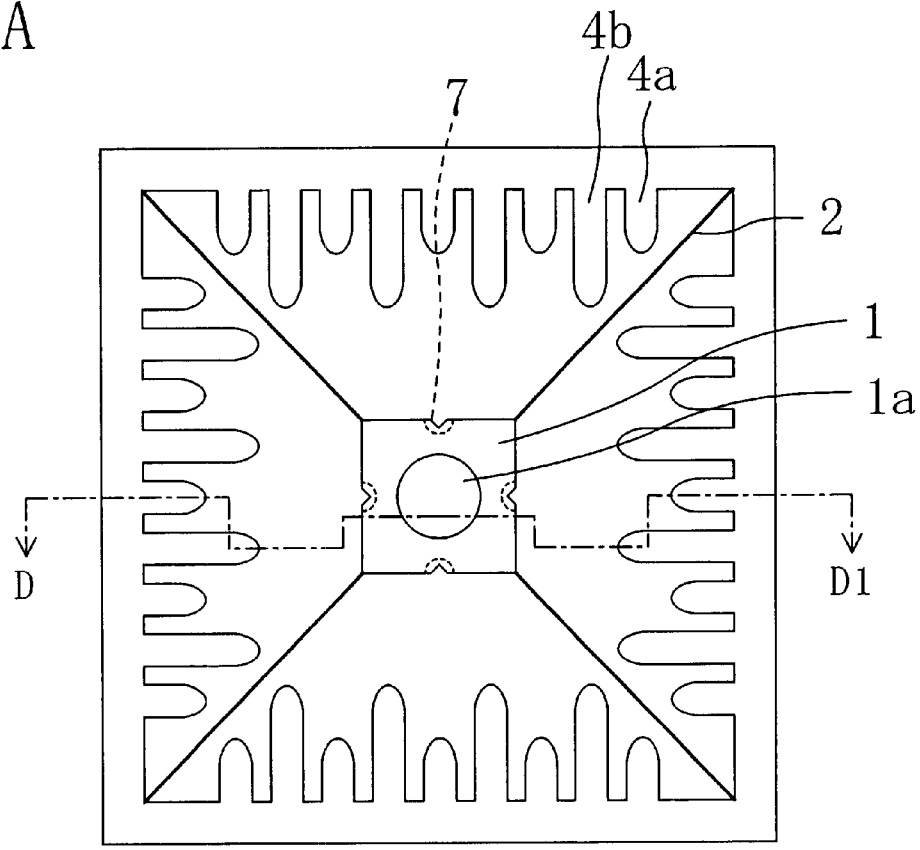
FIG. 8A is a plan view of a lead frame for use in a manufacturing method of the resin-sealed semiconductor device according to the second embodiment of the present invention.
Figure 8B:
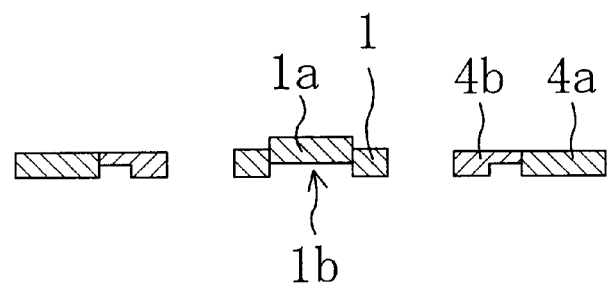
FIG. 8B is a cross-sectional view thereof.

FIGS. 8A, 8B, 9A to 9D and 10 illustrate the manufacturing method of the resin-sealed semiconductor device of the present embodiment. FIGS. 8A and 8B show a lead frame used in the manufacturing method of the resin-sealed semiconductor device of the present embodiment. FIG. 8A is a plan view of the lead frame, and FIG. 8B is a cross-sectional view taken along line D–D1 in FIG. 8A. FIGS. 9A to 9D and 10 are cross-sectional views illustrating the main steps of the manufacturing method.

First, the lead frame used in the manufacturing method of the resin-sealed semiconductor device of the present embodiment will be described.

As shown in FIGS. 8A, 8B, the lead frame of the present embodiment has approximately the same structure and shape as those of the first embodiment except that the lead frame of the present embodiment has suspended lead portions 2 and the sealing sheet is not attached to the bottom surface of the lead frame in the step of preparing the lead frame. The shape of the first recesses 1 is also different from that of the first embodiment. The suspended lead portions 2 are connected to the frame portion of the lead frame at their respective terminal ends, and support the four corners of the die pad portion 1 with their respective tips.

Hereinafter, a process of manufacturing the resin-sealed semiconductor device using the above lead frame will be described.

Figure 9A:
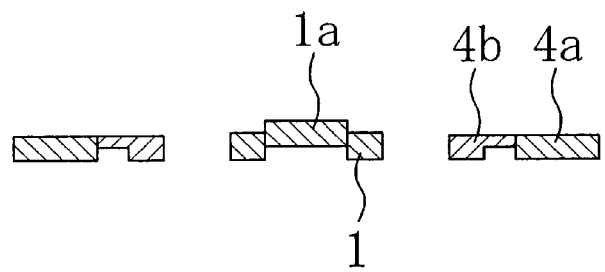
FIG. 9A is a cross-sectional view illustrating the step of preparing a lead frame in the manufacturing method of the resin-sealed semiconductor device according to the second embodiment of the present invention.

First, as shown in FIG. 9A, a lead frame is prepared. The lead frame has a die pad portion 1 provided within a frame portion formed from a metal plate, for mounting a semiconductor element thereon, suspended lead portions supporting the four corners of the die pad portion 1 with their respective tips and connected to the frame portion at their respective terminal ends, and a plurality of first and second lead portions 4a, 4b. The plurality of first and second lead portions 4a, 4b have their respective tips facing the die pad portion 1 and their respective terminal ends connected to the frame portion. The die pad portion 1 has first recesses at its bottom surface.

Figure 9B:
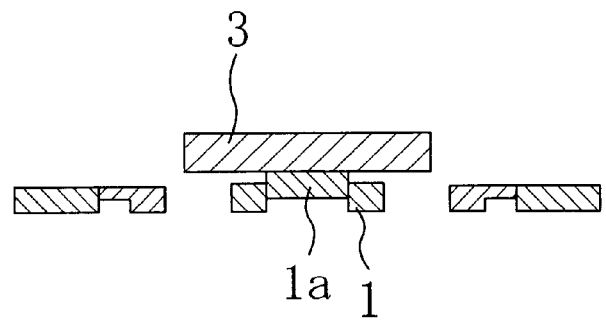
FIG. 9B is a cross-sectional view illustrating the step of mounting a semiconductor element.

As shown in FIG. 9B, a semiconductor element 3 is then bonded to the support portion 1a of the die pad portion 1 of the lead frame with the main surface of the semiconductor element 3 facing upward.

Figure 9C:
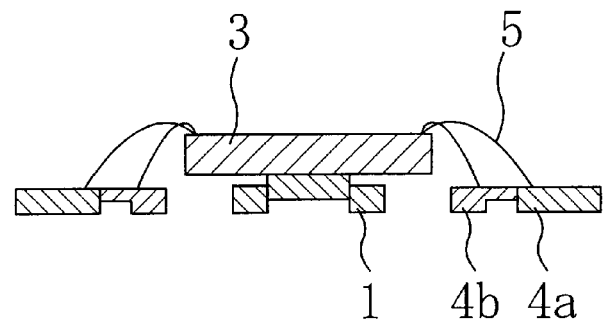
FIG. 9C is a cross-sectional view illustrating the connecting step using thin metal wires.

As shown in FIG. 9C, electrodes of the semiconductor element 3 thus mounted on the die pad portion 1 are electrically connected to the first and second lead portions 4a, 4b of the lead frame by thin metal wires 5.

Figure 9D:
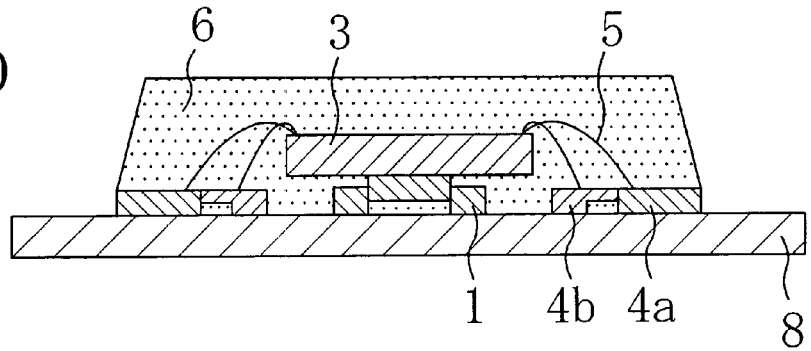
FIG. 9D is a cross-sectional view illustrating the resin sealing step.

As shown in FIG. 9D, a sealing sheet 8 is then attached in close contact with the bottom surface of the lead frame. More specifically, the sealing sheet 8 is attached in close contact with at least the respective bottom surfaces of the first and second lead portions 4a, 4b and the bottom surface of the die pad portion 1. The upper side of the lead frame is then sealed with a sealing resin 6. As a result, the die pad portion 1, the suspended lead portions, the semiconductor element 3, the first and second lead portions 4a, 4b and the connection regions of the thin metal wires 5 are sealed except the bottom surface of the die pad portion 1 and the respective bottom surfaces of the first and second lead portions 4a, 4b.

In this sealing step, the air trapped between the sealing sheet 8 and the die pad portion 1 of the lead frame is released into the first recesses formed in the four sides of the die pad portion 1. Generation of resin voids is thus prevented.

Figure 10:
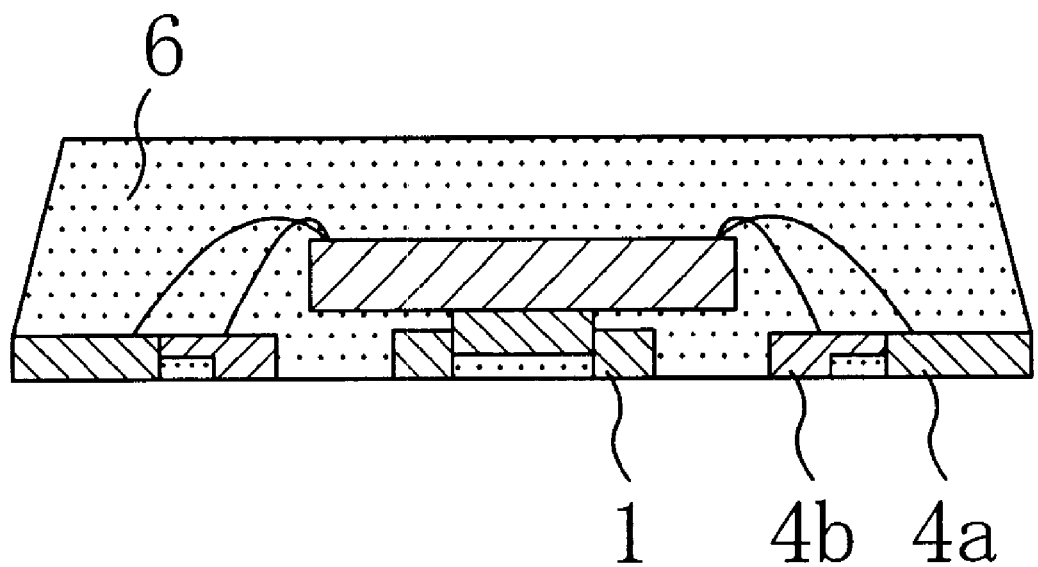
FIG. 10 is a cross-sectional view illustrating the manufacturing method of the resin-sealed semiconductor device according to the second embodiment of the present invention.
Figure 11A:
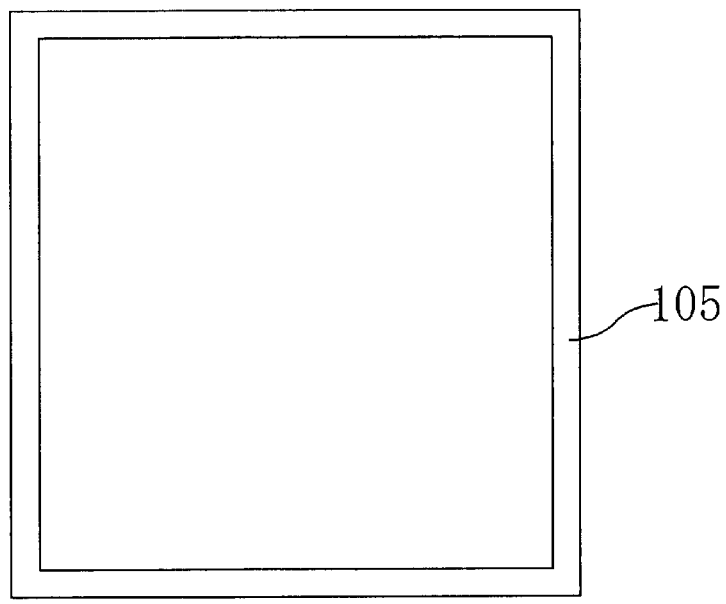
FIG. 11A is a plan view of a conventional resin-sealed semiconductor device.
Figure 11B:
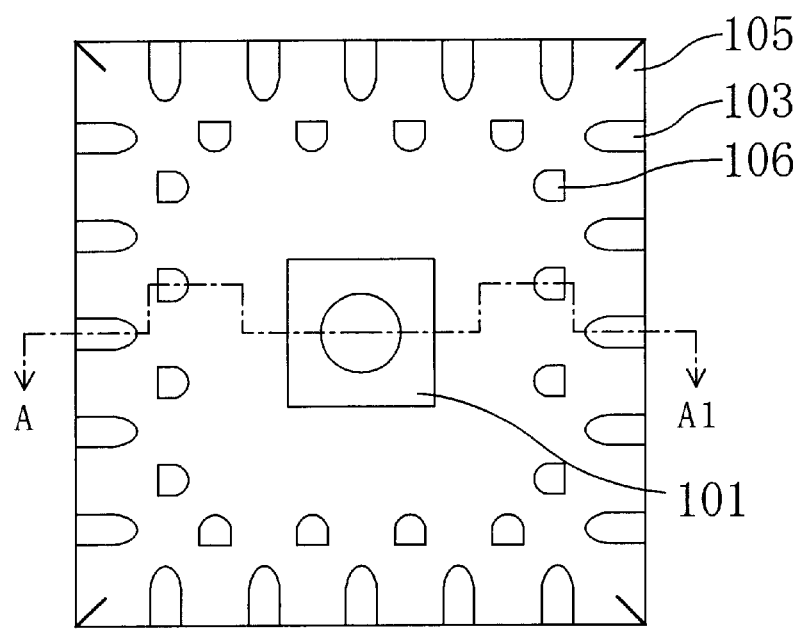
FIG. 11B is a bottom view thereof.
Figure 11C:
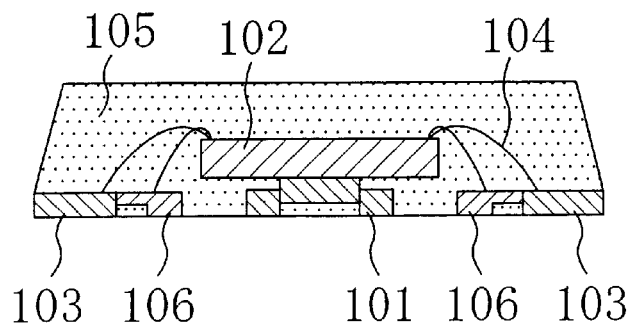
FIG. 11C is a cross-sectional view thereof.
Figure 12A:
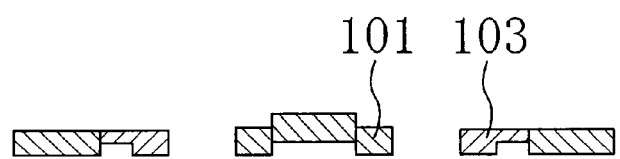
FIG. 12A is a cross-sectional view illustrating the step of preparing a lead frame in a manufacturing method of the conventional resin-sealed semiconductor device.
Figure 12B:
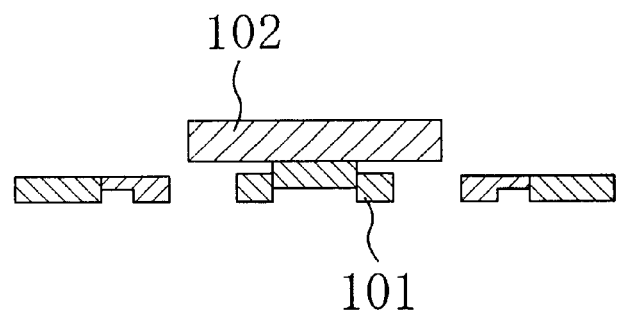
FIG. 12B is a cross-sectional view illustrating the step of mounting a semiconductor element.
Figure 12C:
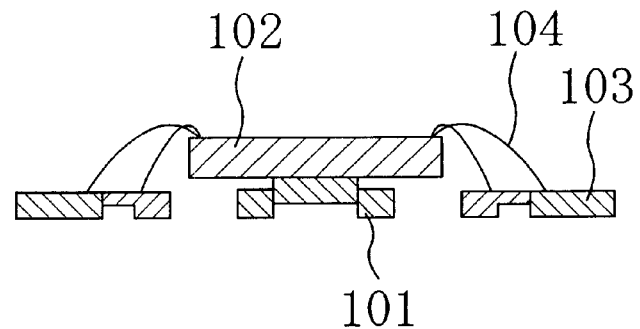
FIG. 12C is a cross-sectional view illustrating the connecting step using thin metal wires.
Figure 12D:
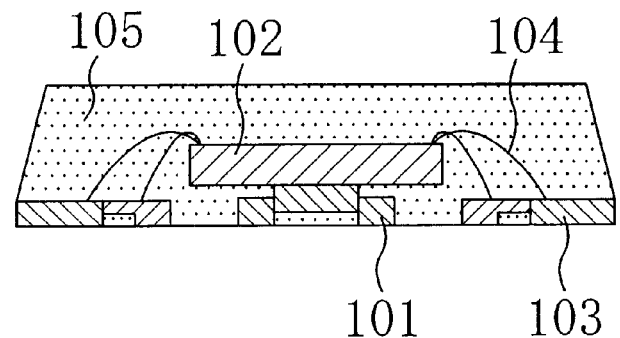
FIG. 12D is a cross-sectional view illustrating the resin sealing step.

As shown in FIG. 10, after the resin sealing step, the respective terminal ends of the suspended lead portions and the first and second lead portions 4a, 4b are cut away so that the resultant terminal ends of the suspended lead portions and the first and second lead portions 4a, 4b are approximately flush with the side surface of the sealing resin 6. In this way, the resin-sealed semiconductor device having the same structure as that described in connection with FIG. 6 is obtained. The resin-sealed semiconductor device of FIG. 10 is a reliable resin-sealed semiconductor device having no resin void generated near the die pad portion 1.

In the resin-sealed semiconductor device and the manufacturing method thereof according to the present embodiment, the die pad portion of the lead frame has first recesses, and the air trapped at the interface between the sealing sheet and the die pad portion in the resin sealing step can be released into the first recesses. This prevents the air from remaining at the interface in the resin sealing step and enables implementation of a void-less resin-sealed semiconductor device.

Note that a resin-sealed semiconductor device having lead portions arranged in two rows is described in the present embodiment. However, the resin-sealed semiconductor device of the present invention may alternatively have the lead portions arranged in a row or in three or more rows. The present invention is widely applicable to a manufacturing method of a resin-sealed semiconductor device having only one side sealed with a resin and having a die pad portion exposed from the resin. A map molding method may be used as a resin sealing method.

As has been described above, the present invention enables implementation of a resin-sealed semiconductor device having no void generated in a sealing resin near the die pad portion. This especially applies to a resin-sealed semiconductor device having a die pad portion exposed from a sealing resin.

Moreover, the present invention allows the air trapped between the sealing sheet and the die pad portion of the lead frame to be released into the first recesses of the die pad portion in the resin sealing step, whereby generation of voids is prevented. Therefore, the manufacturing method of the resin-sealed semiconductor device according to the present invention is an excellent manufacturing method that is widely applicable to a manufacturing method of a resin-sealed semiconductor device having only one side sealed with a resin and having a die pad portion exposed from the resin.

What is claimed is:

1. A resin-sealed semiconductor device, comprising:

a die pad portion for mounting a semiconductor element thereon;

a semiconductor element mounted on the die pad portion and having electrodes;

a plurality of lead portions arranged with their respective tips facing the die pad portion;

thin metal wires for connecting the electrodes of the semiconductor element to the lead portions; and a sealing resin for sealing the die pad portion, the semiconductor element, the lead portions and connection regions of the thin metal wires except a bottom surface of the die pad portion and respective bottom surfaces and terminal ends of the lead portions, wherein the terminal ends of the lead portions are approximately flush with a side surface of the sealing resin, and the die pad portion has a first recess formed in an outer periphery of the bottom surface thereof, an upward projecting support portion for supporting the semiconductor element, and a second recess provided at a region of the bottom surface of the die pad portion that corresponds to the support portion, with the first recess formed at the bottom surface of the die pad portion being a groove-like recess extending from an outer end of the bottom surface of the die pad portion to the second recess.

2. The resin-sealed semiconductor device according to claim 1, further comprising:

suspended lead portions for supporting the die pad portion.

3. The resin-sealed semiconductor device according to claim 1, wherein at least the lead portions include first lead portions arranged with their respective tips facing the die pad portion, and second lead portions extending so that their respective tips are located at a position closer to the die pad portion than are the tips of the first lead portions.

4. The resin-sealed semiconductor device according to claim 3, wherein respective bottom surfaces of the first lead portions and respective bottom surfaces of the second lead portions form land electrodes, and the land electrodes are arranged in at least two rows in a bottom surface region of the sealing resin when viewed two-dimensionally.

* * * * *